US011671053B2

(12) United States Patent
Wang

(10) Patent No.: US 11,671,053 B2
(45) Date of Patent: Jun. 6, 2023

(54) INFLATABLE DIVERGENT FRESNEL LENS AND NON-IMAGING CONCENTRATOR BASED NON-TRACKING SOLAR CONCENTRATOR

(71) Applicant: Yonghua Wang, Klamath Falls, OR (US)

(72) Inventor: Yonghua Wang, Klamath Falls, OR (US)

(73) Assignee: Yong Hua Wang, Klamath Falls, OR (US)

( * ) Notice: Subject to any disclaimer, the term of this patent is extended or adjusted under 35 U.S.C. 154(b) by 0 days.

(21) Appl. No.: 16/873,445

(22) Filed: Apr. 13, 2020

(65) Prior Publication Data

US 2021/0320621 A1 Oct. 14, 2021

(51) Int. Cl.
*H02S 40/22* (2014.01)
*H02S 40/44* (2014.01)
*F24S 23/30* (2018.01)
*G02B 19/00* (2006.01)

(52) U.S. Cl.
CPC .............. *H02S 40/22* (2014.12); *F24S 23/31* (2018.05); *G02B 19/0009* (2013.01); *G02B 19/0042* (2013.01); *H02S 40/44* (2014.12)

(58) Field of Classification Search
CPC ....... H01L 31/00–078; Y02E 10/50–60; H02S 20/00–32; H02S 10/00–40; H02S 30/00–20
USPC .................................................. 136/243–265
See application file for complete search history.

(56) References Cited

U.S. PATENT DOCUMENTS

| 6,111,190 | A  | * | 8/2000  | O'Neill | F24S 23/31 |
| | | | | | 136/246 |
| 6,653,551 | B2 | * | 11/2003 | Chen    | H01L 31/0543 |
| | | | | | 136/246 |
| 2005/0092360 | A1 | * | 5/2005  | Clark   | F24S 23/00 |
| | | | | | 136/259 |
| 2010/0218806 | A1 | * | 9/2010  | Arab    | H01L 31/0547 |
| | | | | | 136/246 |
| 2018/0073772 | A1 | * | 3/2018  | Wang    | F24S 80/52 |

OTHER PUBLICATIONS

John A. Duffie, William A. Beckman, Solar Engineering of Thermal Processes, 4th Edition, 2013, pp. 337-344, Wiley, Hoboken, New Jersey, USA.

* cited by examiner

*Primary Examiner* — Bach T Dinh

(57) ABSTRACT

An inflatable divergent Fresnel lens and non-imaging CPC based non-tracking high concentration ratio solar concentrator system comprises a flexible domed divergent Fresnel lens, and an inflatable non-imaging CPC concentrator with a domed transparent top cover and a flat transparent bottom cover. Where, the flexible domed divergent Fresnel lens is attached onto the said domed transparent cover of the said inflatable non-imaging CPC concentrator. When in operation, the oblique incident sunlight including beam light and diffuse light onto the domed divergent Fresnel lens, is deflected to change its direction, and consequently change its original incident angle relative to the said CPC concentrator from large to small, then eventually fall in the acceptance half-angle to be concentrated by the said CPC in large concentration ratio.

2 Claims, 10 Drawing Sheets

INFLATABLE DIVERGENT FRESNEL LENS AND NON-IMAGING CONCENTRATOR BASED NON-TRACKING SOLAR CONCENTRATOR

TECHNICAL FIELD

The present disclosure relates generally to solar concentrators, more specifically, to inflatable divergent Fresnel lens and non-imaging concentrator based non-tracking solar concentrator.

BACKGROUND

Solar energy is clean, abundant and ubiquitously available over the world. It is so rich that one hour sunshine brings sufficient energy onto earth for entire human being to use for a whole year. And it is totally free. If a very tiny fraction of the entire solar energy is converted into electricity, there is no need to emit any pollution. However, up to now, solar energy contributes less than 3% of total electric power in United States. The grand challenge for the wide-spread adoption of solar technologies is the high cost and low efficiency of the current solar technologies. Although the rapid progress of technical research and development has already extraordinarily reduced the cost of the conventional photovoltaic technology, the price of solar generated electricity is still higher than that of fossil fuel generated electricity. And it is way more expensive than that it potentially should be. For solar energy to be a main stream power supply supporting power grid, building, and transportation systems, novel solar energy collection and conversion systems with ultra-high efficiency and substantially low cost must be created and developed.

Relative to other energy resources, the major issues of solar energy that cause low efficiency and high cost of solar systems stem from the low energy current density of solar radiation. The average solar radiation intensity on earth is around 800 W/m², varying with location, weather and season. Due to the low energy current density, when the widely adopt flat plate photovoltaic panel is used to collect the sunlight, the large area semiconductor devices have to be directly taken to collect and convert the diffusive solar radiation. Large area costly semiconductor inevitably makes the conventional solar system expensive. In order to reduce the area of semiconductor devices as converter, large area solar concentrator is used to condense solar radiation before the converter is used to convert it into electric power in concentrating systems. The relative low cost of solar concentrator substantially reduces the overall cost of concentrating solar system.

While, as the development of conventional silicon photovoltaic technology and the wide-spread adoption of flat plate photovoltaic systems, the fall of the cost of conventional silicon photovoltaic system makes any concentrating system un-plausible. The cost of flat plat silicon photovoltaic panel approaches to the cost of conventional concentrating systems. However, the cost of the solar generated electricity is still way higher than fossil fuel generated electricity. The conventional flat plate photovoltaic technology has already been pushed to its theoretical limit. There is no room for further dramatically reducing its cost and raising its efficiency. A new approach must be explored to extraordinarily reduce the cost of solar concentrator so that the trend of cost falling for solar power systems remains.

Inflatable solar concentrator is able to concentrate sunlight using membranes or films and reflective coating with extremely low cost. Therefore, inflatable solar concentrator provides a path leading to extremely low cost solar power systems and radically reducing the cost of solar energy utilization.

Apart from concentrator, another major driver of the cost of the concentrating solar system is the tracking system. High concentration ratio concentrating system requires high precision tracking. The introduction of the high precision tracking system into the solar concentrating system, which most likely offsets the benefit obtained from the concentrator, not only significantly increase the system cost, but also profoundly reduces the reliability of the entire system, due to the moving parts of the tracking system. Therefore, non-tracking solar concentrator with high concentration ratio is the holy grail for high efficiency and low cost solar system.

U.S. Pat. No. 8,074,638 to Cummings disclosed an imaging inflatable solar concentrator consisting of an assembly made of at least a clear film and a reflective film that inflates into a shape reflecting parallel rays of light to a concentrated focus in the interior or immediate proximity of the assembly. Cummings's invention enables light concentration by using balloon type concentrator made of thin films. This innovation demonstrated potential to realize extremely low cost solar concentration. However, his system is only able to concentrate parallel rays of light not diffuse light, and needs precisely shaped balloon and high precision tracking.

U.S. Pat. No. 4,230,094 to Szulmayer disclosed an imaging system consisting of a convergent Fresnel lens, a parabolic concentrator and a cylindrical receiver. Szulmayer's invention realized stationary concentration of solar energy with high concentration ratio the first time in history. However, his system only works in a limited range of incident angle of light 3G In his system, the convergent Fresnel lens, parabolic concentrator and the cylindrical receiver have to be configured for the specially shaped receiver to be located in a special position to intercept the reflected light. Another drawback of his invention is that his concentrator can't concentrate diffuse light.

U.S. Pat. No. 6,717,045 to Chen disclosed a combined imaging and non-imaging system consisting of a convergent Fresnel lens and a Compound Parabolic Concentrator (CPC). The convergent Fresnel lens concentrates the intensity of sunlight to 5 times above normal level. Then the focused sunlight is further concentrated to 20 times by the second optical concentrator CPC. Apparently, the system is unable to avoid tracking at all.

U.S. Pat. No. 3,923,381 to Winston disclosed non-imaging systems and devices for collection and concentration of electromagnetic energy and particularly solar energy. Winston's disclosure realizes the concentration of solar energy without substantial diurnal tracking. The concentrator of his invention is formed by compounding two parabolic concentrators to form a structure that enables the different reflective surface areas of the concentrator to take turn to reflect incident sunlight to concentrate it. The concentrator is referred as Compound Parabolic Concentrator (CPC). The axes of the two parabolic concentrators form an angle called acceptance half-angle $\theta_c$. The incident light, no matter it is beam light or diffuse light, will be collected and concentrated to the exit aperture, as long as it falls into the acceptance half-angle. It means that as the sun is moving, the incident angle formed between the ray of incident sunlight and the axis of CPC is varying, but as long as the incident angle is smaller than the acceptance half-angle $\theta_c$, the incident sunlight will be collected and concentrated. For a design of CPC with certain $\theta_c$, the concentrator will operate in certain period of time during a day without tracking the sun. In principle, if $\theta_c$ is sufficient, the concentrator is able to concentrate sunlight during an entire diurnal day without tracking. Unfortunately, the concentration ratio of the concentrator is determined by $\theta_c$. The larger the $\theta_c$, the smaller the concentration ratio. For large $\theta_c$, the concentration ratio is a small number. For instance, with $\theta_c=30°$, the concentration ratio is 2 (refer to John Duffie & William Beckman, Solar Engineering of Thermal Processes, $3^{rd}$ Edition, 2006, pp 340-347). For concentration ratio only 10, $\theta_c$ must be as small as °. Ideally for day-long non-tracking concentration, the $\theta_c$ should be at least 75°. For practical application, the concentration ratio should be several hundreds and even more. Therefore, the grand challenge for practical non-imaging concentrator is that it should has small acceptance half-angle for high concentration ratio, but in the mean time has large acceptance half-angle for stationary concentration.

The objective of the present invention is to provide an inflatable non-tracking non-imaging optical system or device that is able to concentrate both beam light and diffuse light to an exit aperture, to dramatically reduce the cost of the solar concentrator, radically eliminate the tracking system, and easily combine with a photovoltaic receiver or heat exchanger to form a concentrating photovoltaic or solar thermal system. In the mean time, the system can be filled with the alternative gases helium and hydrogen to float in air.

The present invention adopts inflatable concentrator to dramatically reduce the cost of solar concentrator, and takes the approach to add a flexible divergent Fresnel lens onto the domed transparent top cover of the inflatable CPC non-imaging concentrator to radically eliminate the tracking system for further reducing the cost of the entire concentrating system.

SUMMARY

According to the present invention, an inflatable non-tracking non-imaging optical system is provided to concentrate both beam light and diffuse light to an exit of aperture, to both radically eliminate the tracking system and dramatically reduce the cost of materials. The embodiment of the invention is an assembly of at least two clear membranes and one reflective membrane. The assembly of the reflective membrane with one of the clear membranes on the top and one of the clear membranes on the bottom is inflated into a Compound Parabolic Concentrator (CPC) with a domed transparent cover on its top and a flat transparent cover at its bottom. The incident light including both of beam light and diffuse light penetrating through the top transparent cover is concentrated to the exit aperture on the transparent bottom by the CPC.

A flexible divergent Fresnel lens made of clear transparent materials such as silicon rubber is added to the domed transparent top cover of the inflatable CPC to form a domed divergent Fresnel lens. When in operation, the oblique incident light including the beam light and the diffuse light is firstly diverged to change the directions of the input light, so as to force the input light originally with large incident angles relative to the CPC to fall in the CPC with small incident angles. Consequently, the addition of the domed divergent Fresnel lens substantially enlarges the acceptance half-angle of CPC to avoid the diurnal tracking for concentration (e.g. realize stationary concentration) and in the mean time realizes large concentration ratio through a system approach.

As the sunlight concentrated by the CPC comes out the bottom exit aperture of the CPC, it is easy to integrate a photovoltaic receiver or heat exchanger into the assembly of the CPC and form a concentrating photovoltaic or solar thermal system. In addition, instead of air, the lighter gases helium and hydrogen can be filled into the concentrator to have it float in the air.

Further aspects and advantages of the present invention will become apparent upon consideration of the following description thereof, reference being made of the following drawing.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

Figure 1:
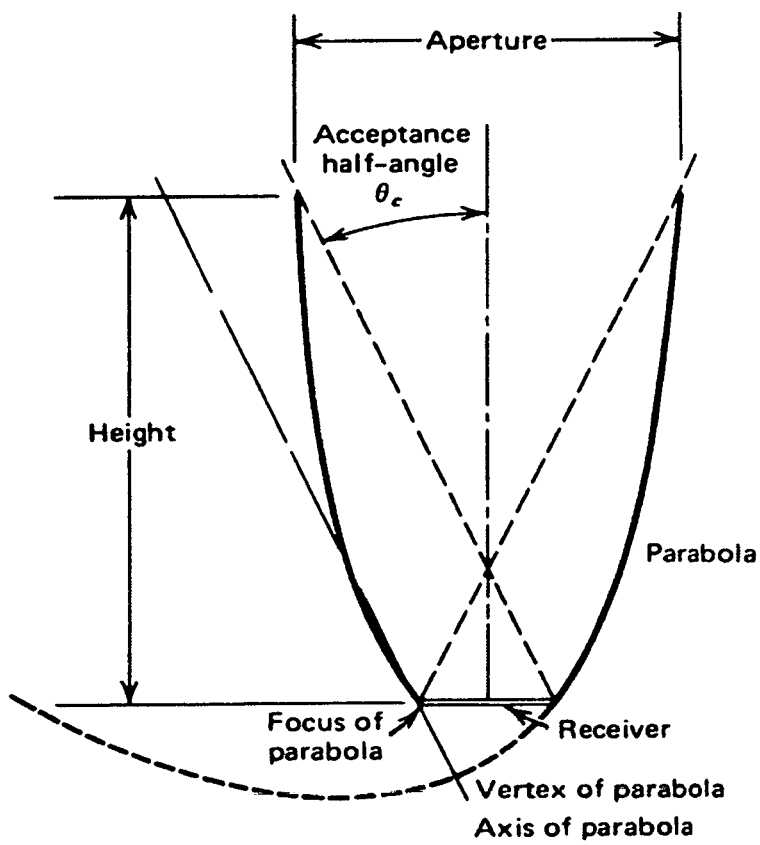
FIG. 1 is the prior art of CPC indicated in a schematic drawing on construction of the CPC concentrator, which introduces some key concepts such as acceptance half-angle $\theta_c$, focus of each of the parabolas, concentrator aperture, receiver, and axis of parabola.
Figure 7:
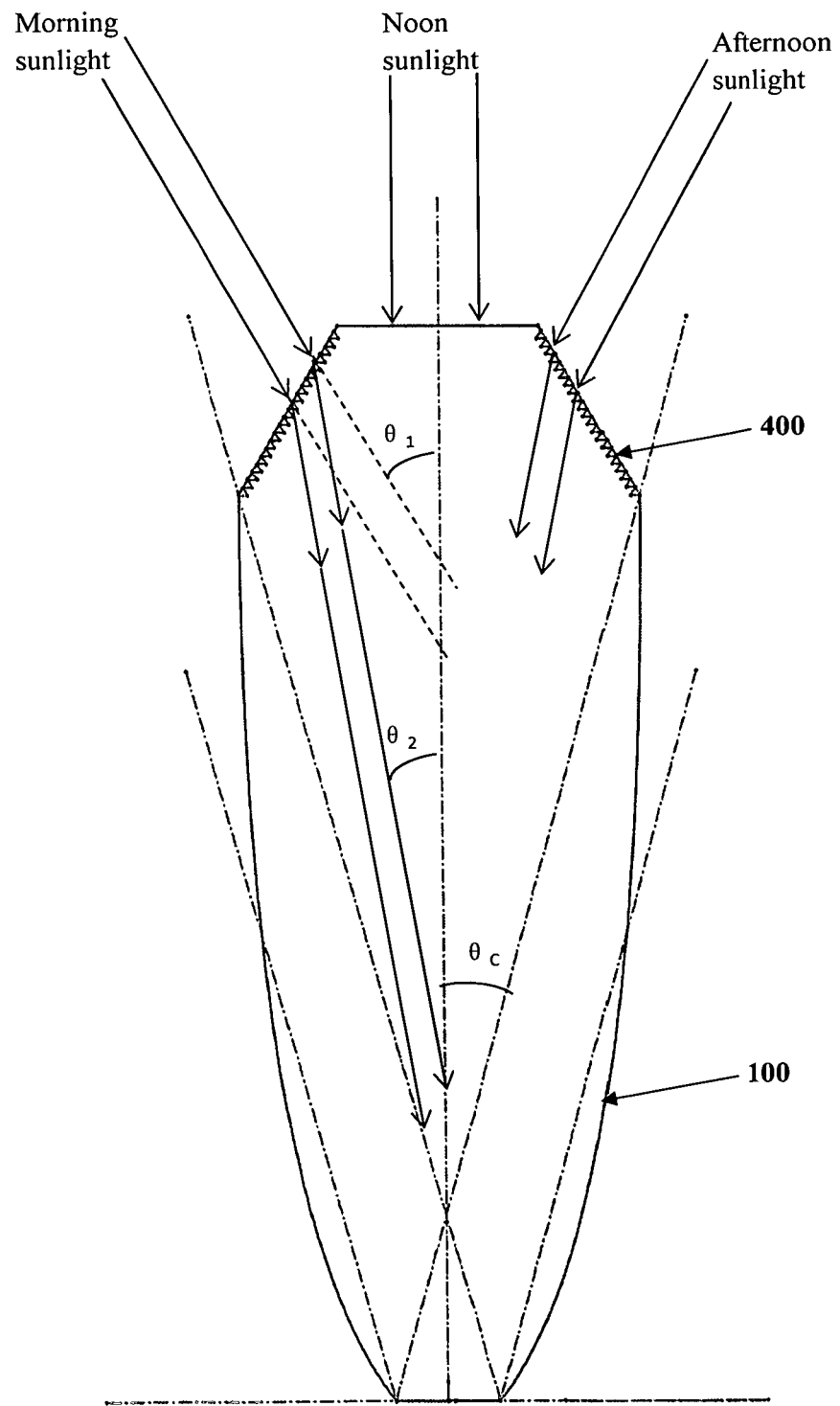
FIG. 7 is the geometric diagram showing the refraction mechanism that changes the direction of the incident light through the domed divergent Fresnel lens during a diurnal day.

Referring to FIG. 1, the prior art of the basic concepts of CPC is illustrated in the reference (FIG. 7.6.1 of John Duffie & William Beckman, Solar Engineering of Thermal Processes, 4th Edition, 2013, pp 337-344). Each side of the CPC is a parabola; the focuses and axis of parabola are indicated. Each parabola extends until its surface is parallel with the CPC axis. The angle between the axis of the CPC and the line connecting the focus of one of the parabolas with opposite edge of the aperture is the acceptance half-angle $\theta_c$. If the reflector is perfect, any radiation entering the aperture at angles between $\pm\theta_c$ will be reflected to a receiver at the base of the concentrator by spectacularly reflecting parabolic reflectors.

Figure 2:
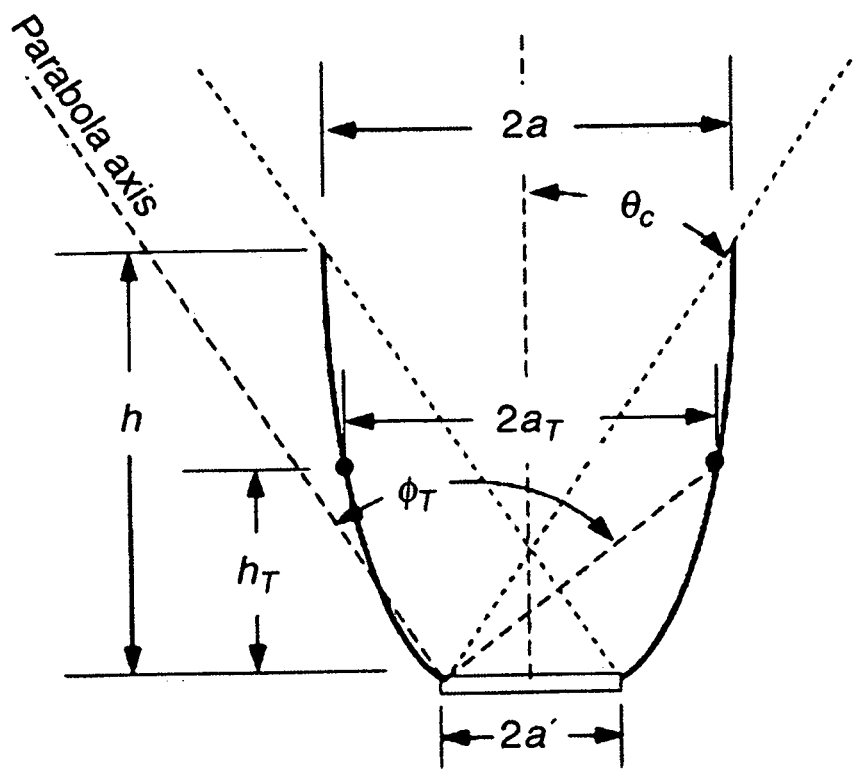
FIG. 2 is the prior art of the truncated CPC with the labels of the concentrator structure variables.

Referring to FIG. 2, the prior art of the CPC is truncated to reduce its height from h to h' with a resulting saving in reflector area but little sacrifice in performance. The truncated CPC is illustrated with the labels of structure variables.

$$f = a'(1 + \sin\theta_c)$$
$$a = \frac{a'}{\sin\theta_c}$$
$$h = \frac{f\cos\theta_c}{\sin^2\theta_c}$$
$$a_T = \frac{f\sin(\phi_T - \theta_c)}{\sin^2(\phi_T/2)} - a'$$
$$h_T = \frac{f\cos(\phi_T - \theta_c)}{\sin^2(\phi_T/2)}$$
$$C_T = \frac{a_T}{a'}$$
$$C = 1/\sin\theta_c$$

As shown in the above formula (FIG. 7.6.3 of John Duffie & William Beckman, Solar Engineering of Thermal Processes, 4th Edition, 2013, pp 337-344), where a' is the half-size of receiver, f is the focal lengthy of the elemental parabola for CPC, $\theta_c$ is acceptance half-angle, a is the half-size of aperture of the CPC, h is the height of CPC, $a_T$ is the half-size of the aperture of truncated CPC, $h_T$ is the height of truncated CPC, $\Phi_T$ is the truncation angle, CT and C are concentration ratios of truncated CPC and full CPC respectively, the concentration ratio is a function of the acceptance half-angles and truncation fraction. The smaller the acceptance half-angle, the larger the concentration ratio. The concentration ratio varies from 1 to 11, as the acceptance half-angle varies from 36° to 5°. For acceptance half-angle 6°, as the height-aperture ratio raises from 1 to 3, the concentration ratio changes from about 4.4 to 8.7. However, small acceptance half-angle means small aperture of concentrator and small time interval with no need for tracking. It is contradict to have high concentration ratio and realize daylong stationary concentration for CPC.

Figure 3:
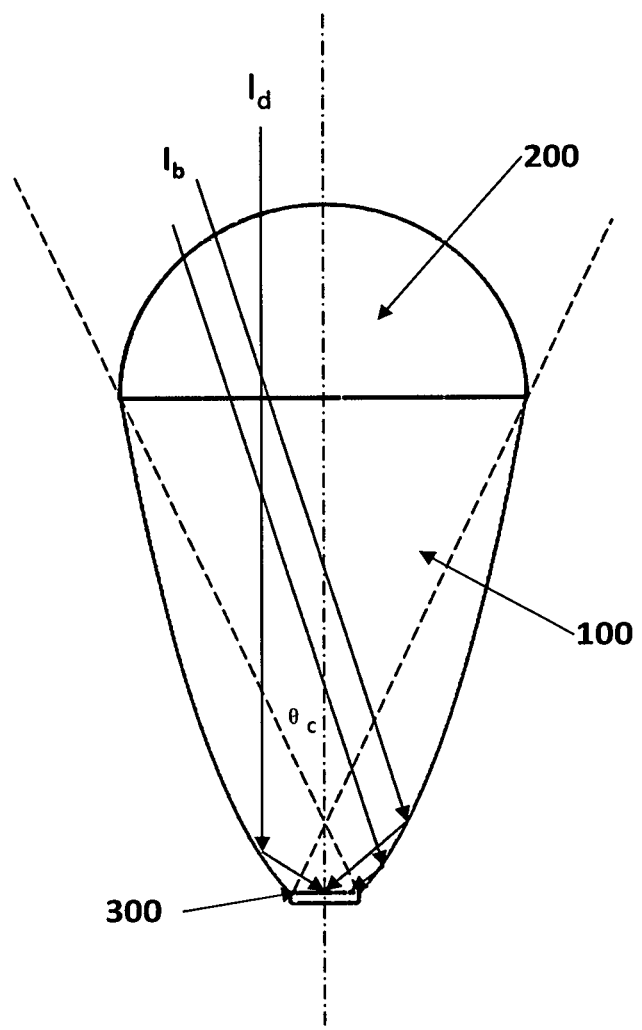
FIG. 3 is the schematic drawing illustrating the work principles of CPC concentrating both the beam light and the diffuse light.

Referring to FIG. 3, the CPC is able to concentrate both the beam light $I_b$ and the diffuse light $I_d$, as long as their incident angles relative to the CPC are smaller than the acceptance half-angle of the CPC.

Figure 4:
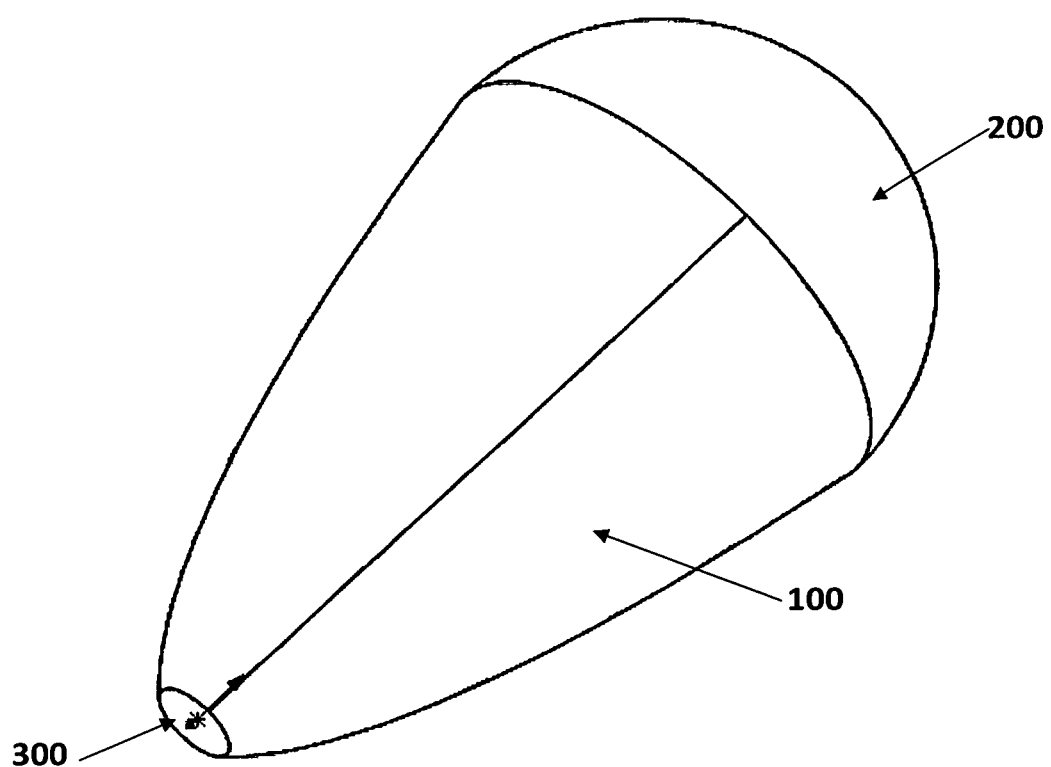
FIG. 4 is a schematic drawing of the inflatable non-imaging concentrator indicating the assembly of two clear membranes and a reflective membrane inflated into a CPC with a domed transparent cover on its top and a transparent cover at its bottom.

Referring to FIG. 4, two transparent membranes and one reflective membrane are sealed together into a pre-form. Then the pre-form is inflated into a balloon type CPC 100, with its top covered with a domed transparent cover 200 and its bottom covered with a flat transparent cover 300.

Figure 5:
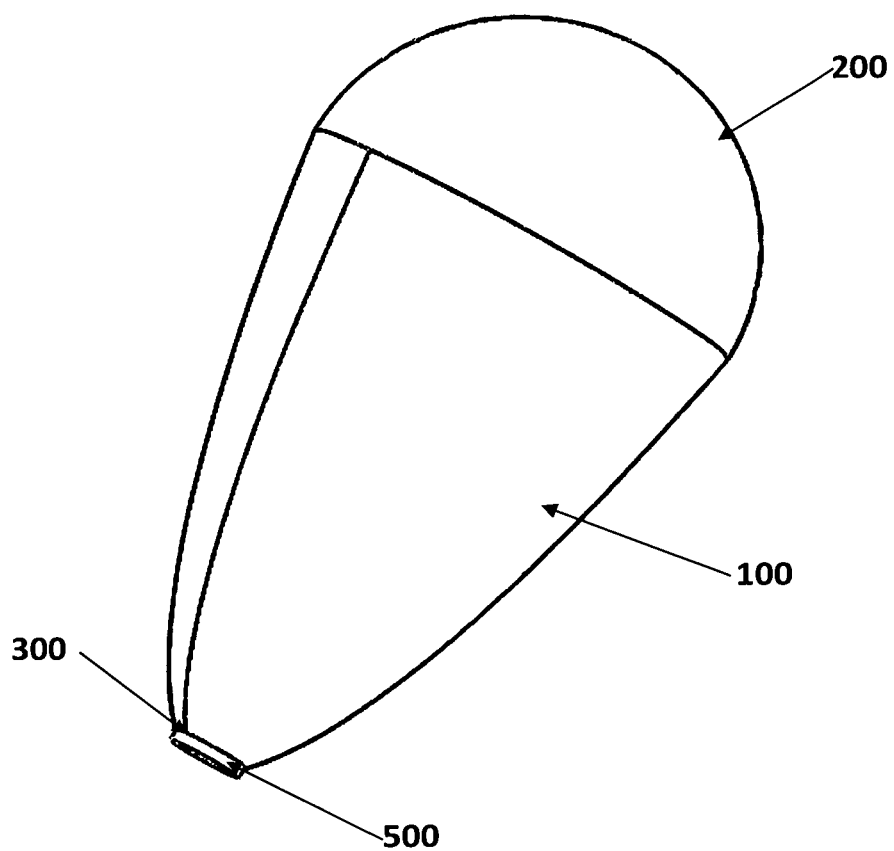
FIG. 5 is a schematic drawing of the concentrating photovoltaic system with a photovoltaic receiver sealed into the inflatable non-imaging concentrator.

Referring to FIG. 5, a photovoltaic receiver 500 is sealed into the inflatable non-imaging concentrator to form a concentrating photovoltaic system.

Figure 6:
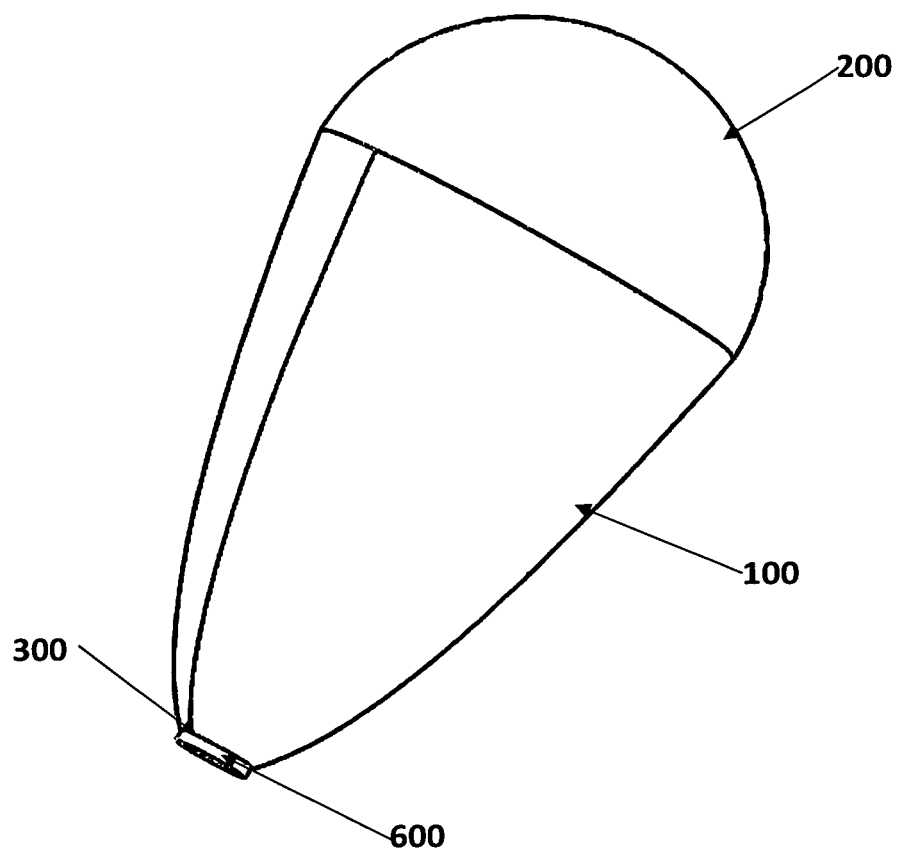
FIG. 6 is a schematic drawing of the concentrating solar thermal system with a heat exchanger sealed into the inflatable non-imaging concentrator.

Referring to FIG. 6, a heat exchanger 600 is sealed into the inflatable non-imaging concentrator to form a concentrating solar thermal system.

Referring to FIG. 7, in the present invention, a flexible divergent Fresnel lens 400 is added on the domed transparent cover of the inflatable CPC 100 with small acceptance half-angle, so that the oblique incident light is refracted to fall in the small acceptance half-angle. During the diurnal day, the morning light with the original incident angle $\theta_i$ relative to the CPC, is refracted by the left-hand side of the domed divergent Fresnel lens, and falls into the CPC with the changed incident angle $\theta_2$, where $\theta_1 > \theta_2$, $\theta_1 > \theta_c$, $\theta_2 < \theta_c$, the afternoon light is refracted by the right-hand side of the domed divergent Fresnel lens, and the noon light is affected little.

Figure 8:
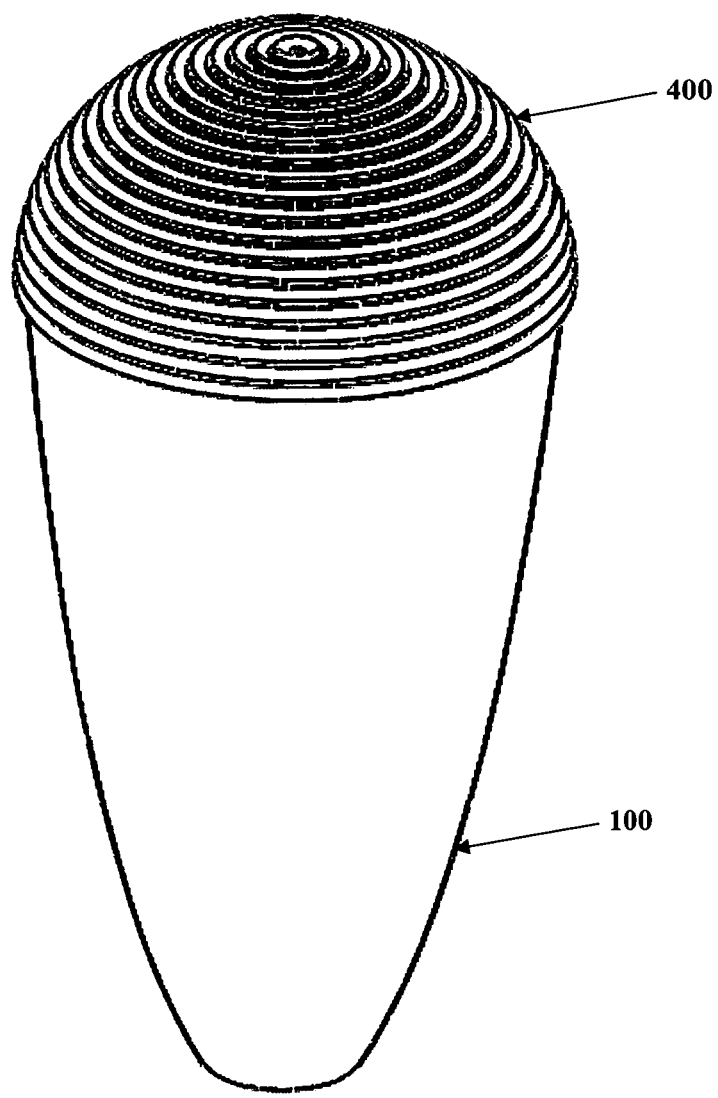
FIG. 8 is the over view of the first stage of the divergent Fresnel lens and CPC based concentrating system.

Referring to FIG. 8, a flexible divergent Fresnel lens 400 made of clear transparent materials such as silicon rubber is added onto the domed transparent top cover 200 of the inflatable CPC non-imaging concentrator 100. And the domed divergent Fresnel lens and the inflatable CPC non-imaging concentrator form a non-tracking close structure concentrator.

Figure 9:
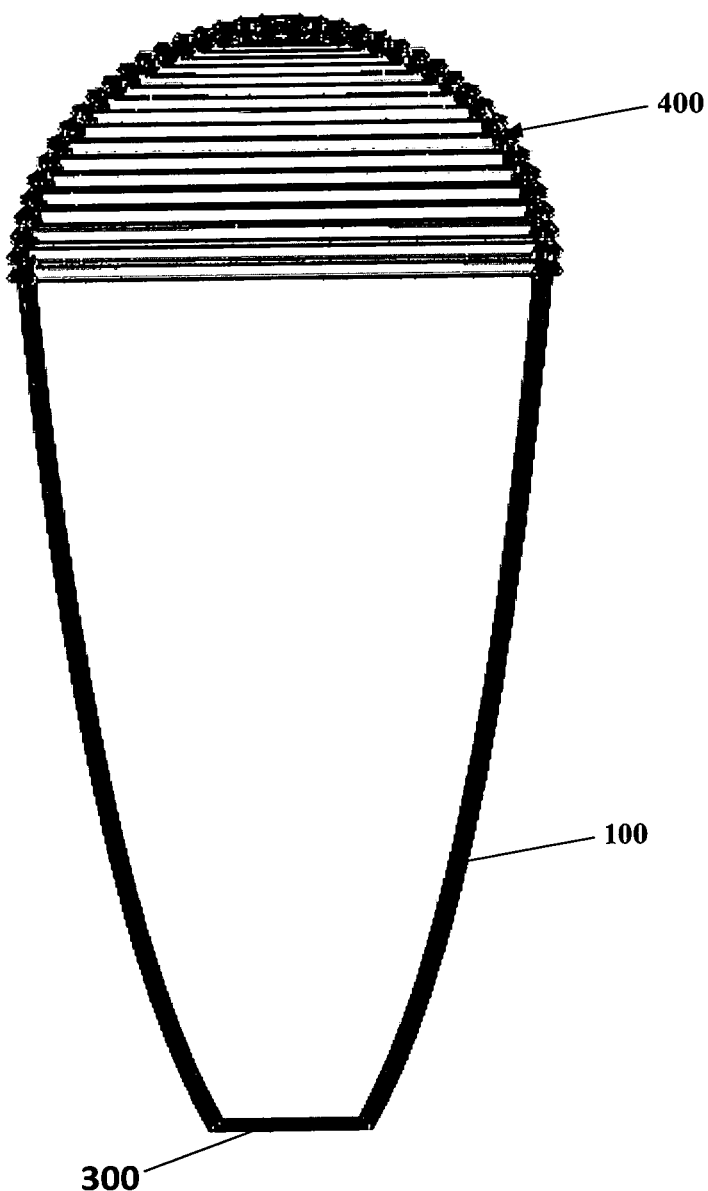
FIG. 9 is the cross-sectional view of the first stage of the divergent Fresnel lens and CPC based concentrating system.

Referring to FIG. 9, the overview of the domed divergent Fresnel lens and CPC based concentrating system is demonstrated in its cross-sectional view. In this design, the domed divergent Fresnel lens 400 only has one layer. It can be designed into multi-layer structure with multiple layers of domed divergent Fresnel lens.

Figure 10:
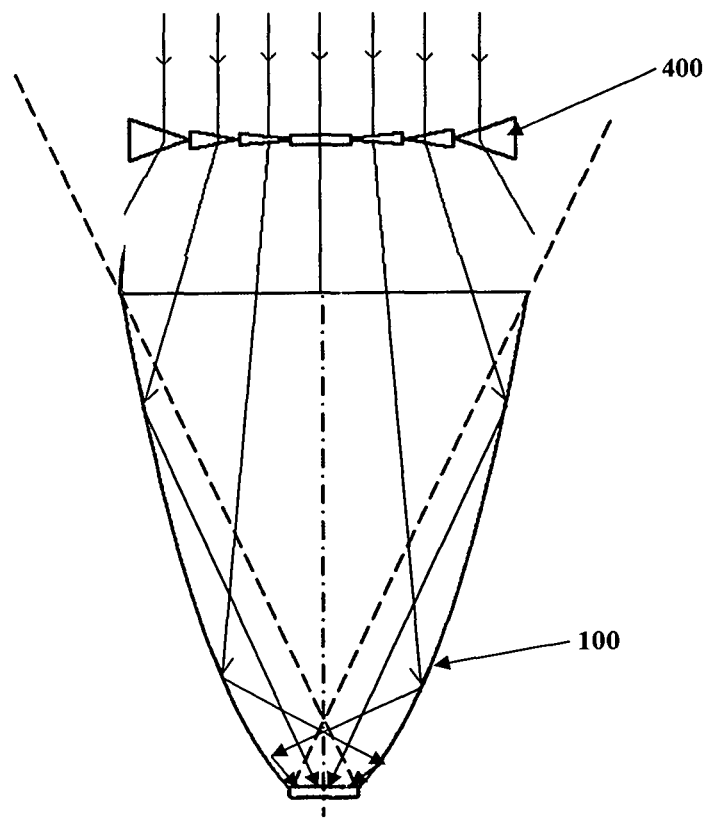
FIG. 10 is the schematic explanation on the general work principle of the divergent Fresnel lens and CPC based non-tracking non-imaging concentrating system with high concentration ratio.

Referring to FIG. 10, the general work principle of the domed divergent Fresnel lens and CPC based non-tracking non-imaging concentrating system is elucidated. The incident light is firstly diverged by the divergent Fresnel lens 400, then is converged by the CPC non-imaging concentrator 100. When the input light obliquely incident, the domed divergent Fresnel lens firstly diverges the light to reduce the incident angles relative to the CPC, then the CPC with small acceptance half-angle concentrates the light in large concentration ratio.

The work principle of the non-tracking concentrator structure is elucidated as the following. As the sun moving from east to west, the sunlight is refracted to change direction by various portion of the domed divergent Fresnel lens surrounding the CPC, so that the refracted sunlight falls into the relatively small acceptance half-angle of the CPC and is concentrated by it. The addition of the domed divergent Fresnel lens to the CPC enlarges the acceptance angle of the CPC, and therefore enables the stationary concentration with high concentration ratio.

From the description above, a number of advantages of the solar concentrator become evident. The inflatable apparatus provides an approach to realize an ultra-light, exclusively cheap, extremely compact solar concentrator. The concentrator is able to concentrate both beam and diffuse light. The addition of the flexible divergent Fresnel lens onto the domed transparent top cover of the inflatable non-imaging CPC concentrator, eliminate the need of tracking system, reduce the cost, and raise the reliability of the concentrating system. The inflatable non-imaging balloon type concentrator has higher tolerance to shape distortion than imaging concentrator. The combination of the inflatable non-imaging balloon type concentrator and the photovoltaic receiver or heat exchanger makes super-light and extremely low cost concentrating photovoltaic system or solar thermal system. The close structure of the concentrator enables the filling of the lighter than air gases helium and hydrogen, and floating in the air.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

I claim:

1. An inflatable divergent Fresnel lens and non-imaging CPC based non-tracking high concentration ratio solar concentrator system comprises a flexible domed divergent Fresnel lens, and an inflatable non-imaging CPC concentrator with a domed transparent top cover and a flat transparent bottom cover, the flexible domed divergent Fresnel lens is attached onto the domed transparent cover of the inflatable non-imaging CPC concentrator;

wherein, when sunlight including beam light and diffuse light obliquely incident onto the domed divergent Fresnel lens, the oblique incident sunlight is deflected to change its direction, and consequently change its original incident angle relative to the CPC concentrator from large to small, then eventually falls in the acceptance half-angle of the CPC concentrator and to be concentrated by the CPC concentrator in large concentration ratio;

wherein the flexible domed divergent Fresnel lens has a series of prisms with different sizes and apexes.

2. The inflatable divergent Fresnel lens and non-imaging CPC based non-tracking high concentration ratio solar concentrator system of claim 1, wherein the flexible divergent Fresnel lens is made of clear transparent materials such as silicon rubber, so that when it is attached onto the domed transparent cover of the inflatable non-imaging CPC concentrator, it will become into a domed divergent Fresnel lens.

\* \* \* \* \*